(12) United States Patent
Shumarayev

(10) Patent No.: US 7,432,741 B1
(45) Date of Patent: Oct. 7, 2008

(54) CONTROLLABLE PRE-DISTORTION FOR TRANSMITTER CIRCUITRY ON PROGRAMMABLE LOGIC DEVICE INTEGRATED CIRCUITS

(75) Inventor: Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/641,990

(22) Filed: Dec. 18, 2006

(51) Int. Cl.
*H03K 19/0175* (2006.01)

(52) U.S. Cl. .......................... 326/87; 326/115
(58) Field of Classification Search .................. 326/115, 326/127, 83, 86, 87
See application file for complete search history.

(56) References Cited

U.S. PATENT DOCUMENTS

| | | | | |
|---|---|---|---|---|
| 4,423,385 A | * | 12/1983 | Evans | 330/9 |
| 6,653,886 B1 | * | 11/2003 | Lee et al. | 327/374 |
| 7,019,759 B1 | * | 3/2006 | Moore et al. | 345/619 |

* cited by examiner

*Primary Examiner*—James H Cho
(74) *Attorney, Agent, or Firm*—Ropes & Gray LLP; Robert R. Jackson

(57) ABSTRACT

Transmitter driver circuitry includes multiple output driver stages, each of which receives a respective differently-phased version of an output signal for application to an output node of the circuitry. Each stage includes a primary current source. The circuitry also includes at least one secondary current source. The secondary current source can be used to supply supplementary current to the output node to eliminate or at least substantially reduce offset at the output node.

31 Claims, 3 Drawing Sheets ions: CONTROLLABLE PRE-DISTORTION FOR
TRANSMITTER CIRCUITRY ON
PROGRAMMABLE LOGIC DEVICE
INTEGRATED CIRCUITS

BACKGROUND OF THE INVENTION

This invention relates to programmable logic integrated circuit devices ("PLDs"), and more particularly to PLDs having transmitter circuitry for such purposes as outputting high-speed serial data signals.

PLDs are relatively general-purpose devices that various users may employ in any of a relatively wide range of different system applications. Each user of a particular PLD product "programs", "configures", or "customizes" that product to function in the desired way in that user's system. A PLD product may include one or more channels of transmitter circuitry (e.g., for use in outputting one or more high-speed serial data signals). A user may use such transmitter circuitry to output one or more signals for application to one or more other components of a system (e.g., via a printed circuit board or PCB on which the PLD and other components are mounted.)

Integrated circuits are becoming smaller, voltages used on such devices are becoming lower, and data rates are becoming higher. These trends are making it increasingly difficult to provide transmitter circuitry on PLDs that can function satisfactorily in a range of possible user applications. Some of the reasons for this are detailed in the next paragraph.

Transistor random mismatch tends to increase as integrated circuits are made smaller (so-called smaller "technology nodes"). Such mismatch can lead to random transmitter ("TX") path offset. (Offset is a voltage under some or all conditions that is different than a desired reference voltage.) The impact of such an offset tends to become more important as data rates increase. This can be so for such reasons as reduced available timing margins and/or phase noise amplification over pre-existing PCB back-plane ("BP") designs at high data rates. A signal that is initially distorted at the TX driver output (which is the BP input) may be further distorted after passing through the BP, which may have bandwidth that is significantly lower than the carrier frequency.

Another possible reason for TX output distortion may be output driver voltage. A PLD product may be designed for use in systems requiring an output driver to operate (for example) at either 1.2 or 1.5V. This may mean that the TX path is deterministically mismatched, which can lead to reduced TX driver matching and correspondingly reduced overall system performance.

TX drivers may have several output paths due to pre-emphasis requirements. Each such path needs to be considered as a potential source of mismatch. Depending on the user's link requirement, the number of taps and their strength at the output may differ, leading to possible variation in mismatch.

SUMMARY OF THE INVENTION

In accordance with the present invention, a PLD includes programmable TX path pre-distortion. This programmability is preferably provided by programmable circuitry of the PLD. The TX path circuitry itself is preferably relatively simple, although it is able to supply mismatch flags or signals to other parts of the PLD, and to receive and respond to pre-distortion control signals received from those other parts of the PLD. So-called soft IP (intellectual property) implemented in the other parts of the PLD processes the mismatch flags or signals from the TX path circuitry, and produces pre-distortion control signals for application to the TX path circuitry to cause that circuitry to eliminate (or at least substantially reduce) its mismatch. In this way, each TX channel can be custom-calibrated to deal with such possible issues as (1) its possibly unique transistor mismatch, and/or (2) the user's configuration of power supply, Vod (voltage swing used for data signals), and pre-emphasis settings.

TX design in accordance with the invention can facilitate technology migration (e.g., from one integrated circuit fabrication design rule (size or scale) to another, different design rule) because final matching is done via soft IP in the PLD. The TX "hooks" (mismatch flags and/or pre-distortion control signals) can give the PLD better analog DFT (design-for-test) features.

Further features of the invention, its nature and various advantages, will be more apparent from the accompanying drawings and the following detailed description.

DETAILED DESCRIPTION

Figure 1:
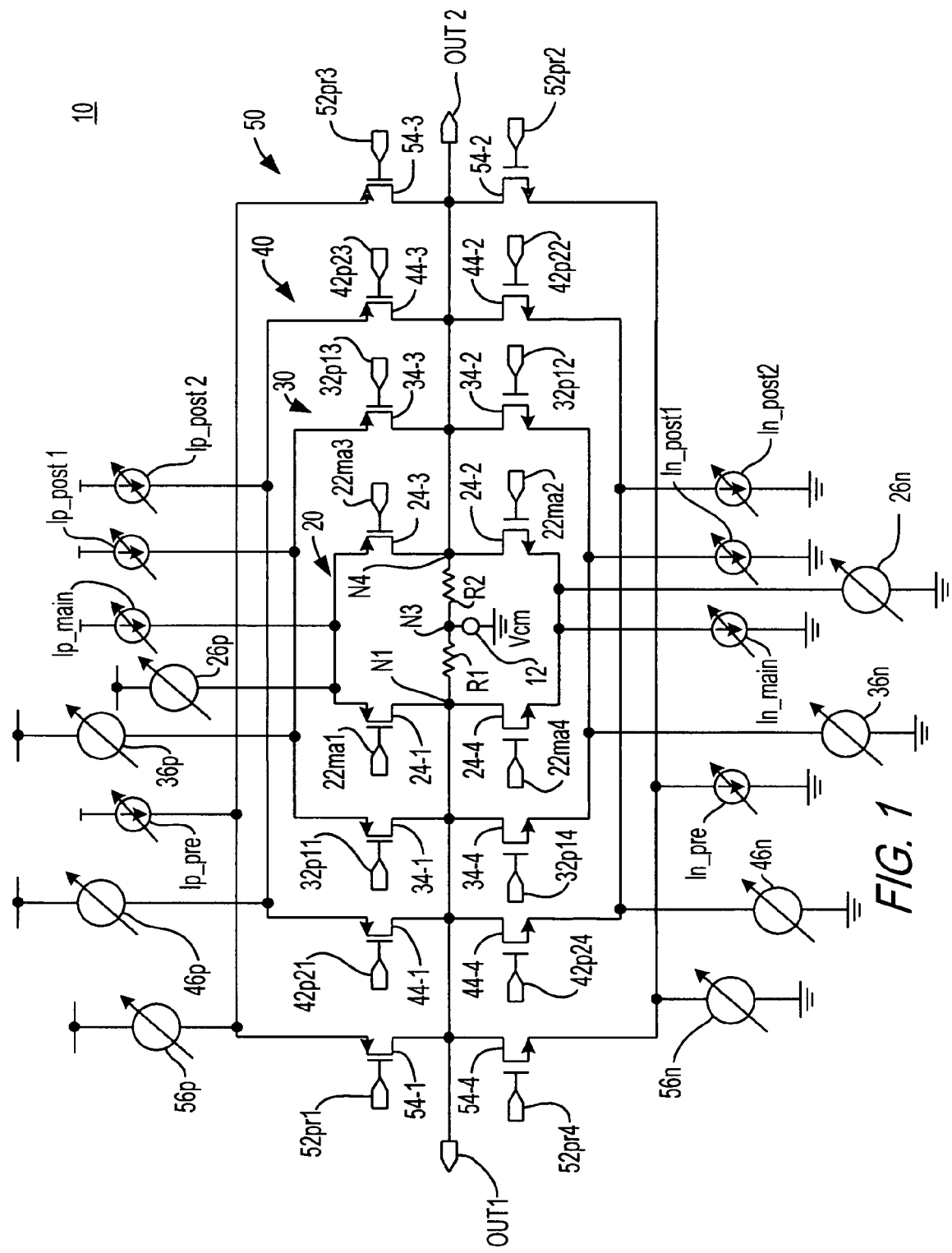
FIG. 1 is a simplified schematic block diagram of an illustrative embodiment of TX path circuitry in accordance with the invention.

FIG. 1 shows an illustrative embodiment of a TX driver 10 in accordance with the invention. TX driver 10 is an AB class driver. This means that it is a push-pull, differential driver including both NMOS and PMOS transistors. Driver 10 has four stages. These are a so-called "main" stage 20, a "pre" stage 50, a "post1" stage 30, and a "post2" stage 40. Data to be transmitted is applied (in differential form) to the input terminals 22*ma*1 through 22*ma*4 of main stage 20. For example, terminals 22*ma*1 and 22*ma*2 may receive the "true" version of the data signal, and terminals 22*ma*3 and 22*ma*4 may receive the "complement" version of the data signal.

Post1 stage 30 receives a version of the data signal that is delayed in time (i.e., phase-shifted) by a first delay amount relative to the main stage data signal. For example, the amount of this delay may be one bit period or interval of the data signal. Alternatively the amount of this delay may be more or less than one bit period (e.g., some fraction of a bit period). The post1 version of the data signal is applied in true and complement form to the inputs 32*p*11 through 32*p*14 of post1 stage 30. For example, the true form may be applied to inputs 32*p*11 and 32*p*12, and the complement form may be applied to inputs 32*p*13 and 32*p*14.

Post2 stage 40 receives a version of the data signal that is delayed (phase-shifted) even more than the delay of the post1 signal. For example, the post2 delay may be twice the amount of the post1 delay. Alternatively, the post2 delay maybe more or less than that amount relative to the post1 delay. The post2 version of the data signal is applied to the inputs 42*p*21 through 42*p*24 of post2 stage 40. For example, the true form of the post2 signal may be applied to inputs 42*p*21 and 42*p*22, while the complement form of the post2 signal may be applied to inputs 42*p*23 and 42*p*24.

Pre stage 50 receives a version of the data signal that is advanced in time (phase-shifted) relative to the main stage data signal. For example, the pre stage signal may be advanced by one bit period or interval relative to the main stage data signal. Alternatively, the pre signal may be advanced by more or less than that amount (e.g., by some fraction of a bit period). The pre signal is applied to pre stage input terminals 52*pr*1 through 52*pr*4. For example, the true form of the pre signal may be applied to inputs 52*pr*1 and 52*pr*2, while the complement form of the pre signal may be applied to inputs 52*pr*3 and 52*pr*4.

Driver 10 is provided with pre and post stages (in addition to main stage 20) so that the signal to be transmitted can be given any of a wide range of pre and/or post pre-emphasis characteristics. The numbers of pre and post stages included in driver 10 can be different from the numbers shown in FIG. 1 if desired.

Each stage of driver 10 includes a primary "p" current source connected in series with a switching transistor network and another primary "n" current source. Each switching transistor network includes two transistor pairs that are connected in parallel with one another (the transistors in each pair being connected in series with one another). For example, main stage 20 includes primary current source Ip_main connected in series with transistor network 24-1 through 24-4 and primary current source In_main. Transistors 24-1 and 24-4 are connected in series with one another; transistors 24-3 and 24-2 are connected in series with one another; and the pair 24-1 and 24-4 is connected in parallel with the pair 24-3 and 24-2. Resistors R1 and R2 are connected in series (i.e., as a voltage-dividing resistor pair) between (1) the node N1 between transistors 24-1 and 24-4; and (2) the mode N2 between transistors 24-3 and 24-2. The node between resistors R1 and R2 is connected to a "common mode" voltage source Vcm. The differential output terminals OUT1 and OUT2 are also respectively connected to nodes N1 and N2.

Each of the other stages 30, 40, and 50 has the same type of components and construction described above for main stage 20. In addition, each of the other stages is connected to operate in parallel with main stage 20 from the standpoint of the effect of each stage on nodes N1 and N2 and output signals OUT1 and OUT2. Thus it will be sufficient to merely list the components of each stage 30, 40, and 50, without repeating in detail all the interconnections among and between those components. Post1 stage 30 includes current source Ip_post1, transistors 34-1 through 34-4, and current source In_post1. Post2 stage 40 includes current source Ip_post2, transistors 44-1 through 44-4, and current source In_post 2. Pre stage 50 includes current source Ip_pre, transistors 54-1 through 54-4, and current source In_pre.

Note that current sources Ip_main, In_main, Ip_post1, In_post1, Ip_post2, In_post2, Ip_pre, and In_pre are all shown as variable in strength. This variability is preferably controlled by other circuitry that is not shown, but that may include other circuitry of the PLD that includes driver 10. Such variability of the strength of these current sources is an aspect of how driver 10 may be controlled to give drive strength of varying amounts, and/or pre and/or post emphasis of different kinds and strengths.

(A note with respect to terminology: All of the modifications to the basic main signal output that may be provided by stages 30-50 are "pre-emphasis" in the sense that they modify the output signal before it goes out into whatever transmission medium transmits it. This is not to be confused with the other terms like "pre" and "post" that are used herein, which tend to refer to whether the modification is ahead of or behind the main data signal. Sometimes such "pre" and/or "post" modification may be referred to in combination with the word "emphasis" (e.g., as in "post emphasis"). This is not intended to be different from or contrary to "pre-emphasis," but is rather just one form (i.e., the "post" form) of "pre-emphasis." Similarly, "pre emphasis" is another form of the general class of signal modification known as "pre-emphasis." Other phrasing that could be used is "pre pre-emphasis" or "post pre-emphasis.")

Each pair of primary current sources that has thus far been described (e.g., Ip_main and In_main, or Ip_post1 and In_post1) tend to be controlled in tandem to have the same strength, and therefore a balanced effect, so that there is no net current to or from Vcm from or to the node N3 that is connected between resistors R1 and R2. However, thus controlling the primary current source pairs in tandem may not always achieve the objective of zero current to and/or from Vcm. In that case, there will be some offset in the OUT1/OUT2 signal pair under at least some conditions. This can be undesirable. The present invention aims to reduce or eliminate such offset as will now be described.

In accordance with the illustrative embodiment of the present invention that is shown in FIG. 1, each stage of driver 10 is additionally provided with a secondary current source in parallel with each of that stage's primary current sources. Thus, for example, secondary current source 26*p* is connected in parallel with primary current source Ip_main. Similarly, secondary current source 26*n* is connected in parallel with primary current source In_main. To complete this listing of parallel primary and secondary current sources, they are: Ip_post1 and 36*p*; In_post1 and 36*n*; Ip_post2 and 46*p*; In_post2 and 46*n*; Ip_pre and 56*p*; and In_pre and 56*n*.

As shown in FIG. 1, the strength of each of secondary current sources 26*p*, 26*n*, 36*p*, 36*n*, 46*p*, 46*n*, 56*p*, and 56*n* is preferably individually variable and controllable. The strengths of these secondary current sources can be controlled to eliminate or at least substantially reduce offset that may be present in driver 10 without the benefit of these secondary current sources. Control of the variable strength of the secondary current sources (e.g., 26*p*, 26*n*, etc.) is preferably provided by other circuitry that is not shown in FIG. 1. This other circuitry may include other circuitry on the PLD that includes driver 10.

To recapitulate the foregoing, and to continue on, FIG. 1 shows an illustrative TX driver 10 (AB class) with several additional current sources 26*p*, 26*n*, 36*p*, 36*n*, etc., that are pull-up (e.g., 26*p*) and pull-down (e.g., 26*n*) that enable individual off-set cancellation by introducing distortion into main driver stage 20 and each pre and post driver stage 30, 40, and 50. The idea is to use secondary current sources like 26*p*, 26*n*, 36*p*, 36*n*, etc., to misbalance pull-up and pull-down currents into the direction opposite to any natural path offset. In other words, the secondary current sources are used to selectively introduce appropriate pre-distortion into driver 10. A similar approach can be used for other types of drivers (e.g., A class drivers, such as those used for true CML signaling). A typical A class driver can include only the NMOS (lower) half of the FIG. 1 circuitry, or only the PMOS (upper) half of the FIG. 1 circuitry.

Note that component 12 in FIG. 1 may represent what may be called Vcm driver circuitry. A typical objective is for current through circuitry 12 to be zero when driver 10 is connected to the transmission medium (e.g., a back-plane circuit) that it is to drive. Circuitry 12 (e.g., the above-mentioned Vcm driver circuitry) can be used to observe any actual mismatch by monitoring current flowing into it. Alternatively, sense-amplifiers ("sense-amps") can be placed on the OUT1 and OUT2 nodes to read the voltage at the output. This is another possible means for observing mismatch. The driver circuitry may already have such sense-amps if, for example, an industry-standard PCI-E RX detect feature is supported.

Figure 2:
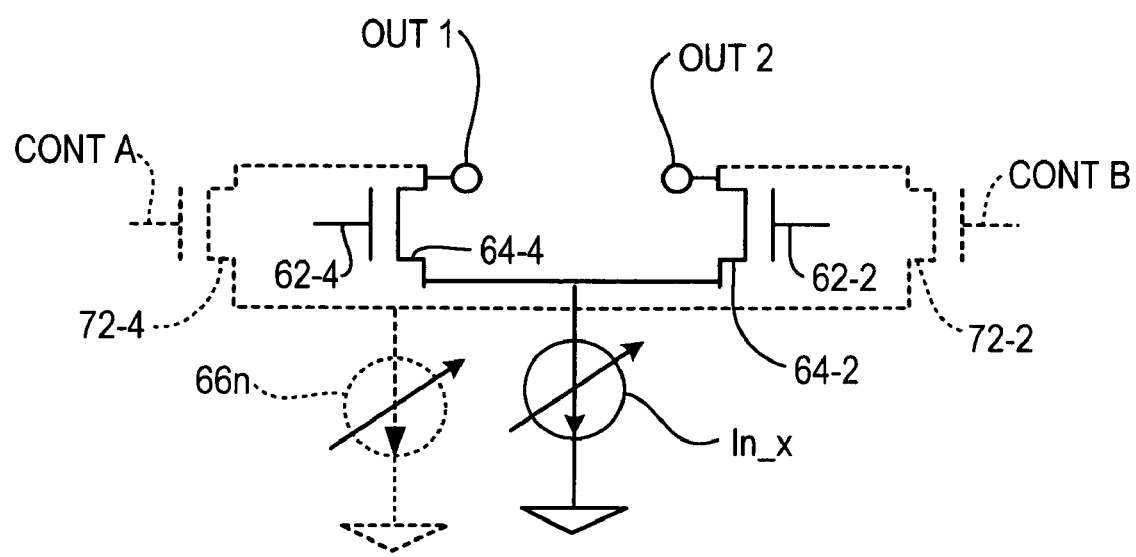
FIG. 2 is a simplified schematic block diagram of an illustrative embodiment of a possible alternative construction of an aspect of circuitry of the type shown in FIG. 1.

FIG. 2 illustrates an alternative embodiment that may permit finer pre-distortion. FIG. 2 may show a portion of one representative stage of an AB class driver (e.g., like FIG. 1). Or FIG. 2 may show one representative stage of an A class driver that employs NMOS transistors (e.g., like the lower half of FIG. 1). FIG. 2 has still other possible interpretations that will be described after a basic description of FIG. 2 has been given.

In FIG. 2 transistors 64-2 and 64-4 can be thought of as like the two lower transistors in any of stages 20, 30, 40, and 50 in FIG. 1. As in FIG. 1, complementary data signals (e.g., main, pre, post1, or post2) are applied to inputs 62-2 and 62-4. Primary current source In_x is like any of primary current sources In_main, In_post1, In_post2, and In_main in FIG. 1. Secondary current source 66n can be like any of secondary current sources 26n, 36n, 46n, and 56n in FIG. 1. In FIG. 2, however, separate transistors 72-2 and 72-4 are provided for connecting secondary current source 66n to output nodes OUT1 and OUT2. Transistors 72-2 and 72-4 are controlled by complementary control signal CONTA and CONTB. Accordingly, only one of transistors 72-2 and 72-4 will be enabled at any given time (e.g., for any given use of the driver circuitry). If more pull down on node OUT1 is needed to reduce or eliminate offset that has been found to exist, then CONTA will be asserted to turn on transistor 72-4 (with transistor 72-2 being consequently turned off). Alternatively, if more pull down on node OUT2 is needed to reduce or eliminate offset that has been found to exist, then CONTB will be asserted to turn on transistor 72-2 (with consequent turning off of transistor 72-4).

As has been said, if the driver is a push-pull driver, then FIG. 2 shows only half of the circuitry that would be provided. Another pull-up half would be provided (e.g., as above the horizontal centerline in FIG. 1). Alternatively, only the pull-up circuitry could be employed, instead of the pull-down circuitry that is shown in FIG. 2. Circuitry like the FIG. 2 circuitry (either pull-down-only or with either of the modifications that have just been mentioned (e.g., push-pull or pull-up-only) can be provided for each stage of a driver (e.g., main, post1, post2, and/or pre stages). Alternatively, only one set of circuits like elements 66n, 72-2, and 72-4 may be provided for a multistage driver. In this last alternative the objective is to use components 66n, 72-2, and 72-4 or the like to reduce an average mismatch condition at OUT1/OUT2. If this circuitry is replicated for each stage, then each stage's contribution to output mismatch can be individually targeted for reduction by the components like 66n, 72-2, and 72-4 that are provided for that stage.

Figure 3:
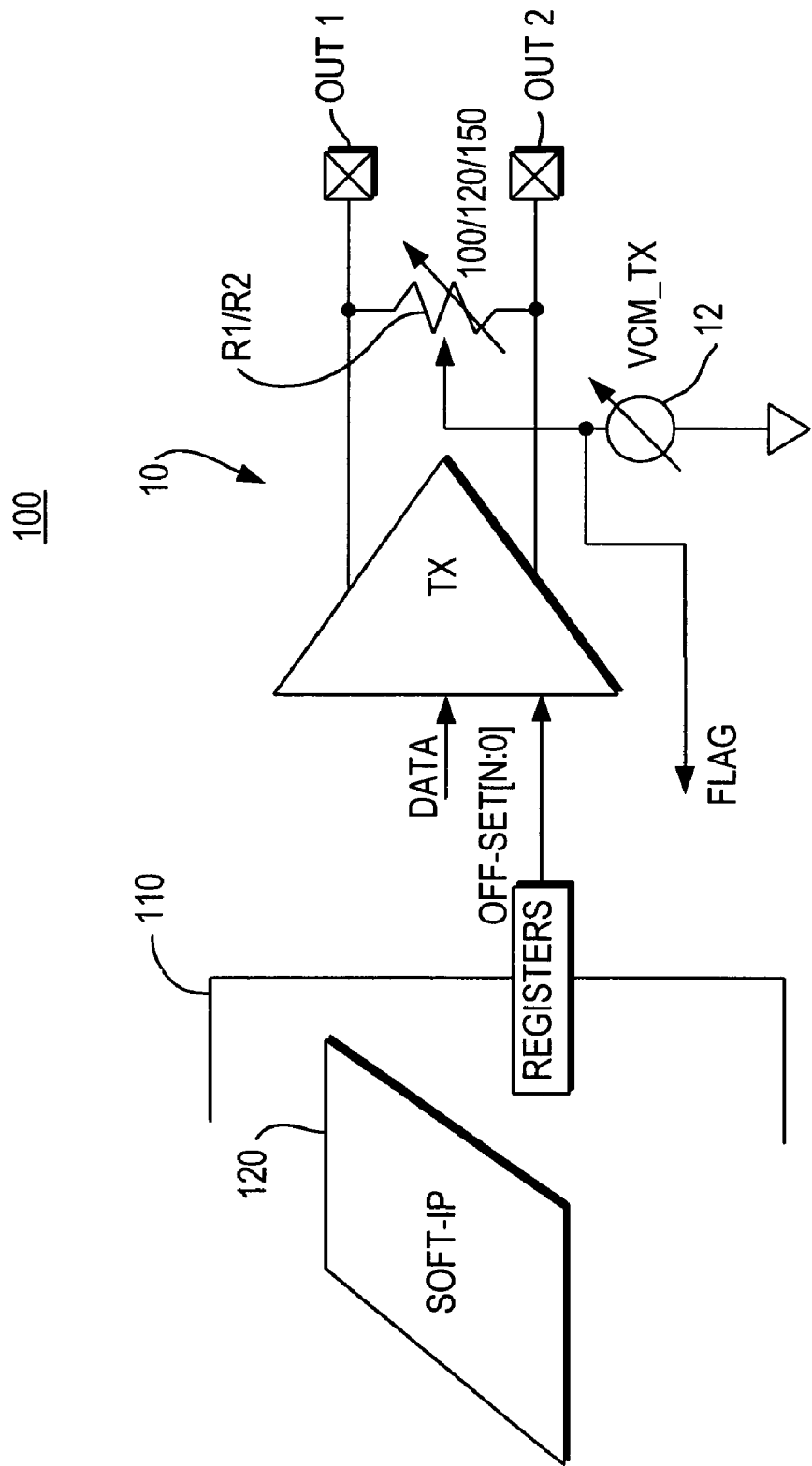
FIG. 3 is a simplified schematic block diagram of an illustrative embodiment of additional circuitry in accordance with the invention.

FIG. 3 shows how driver circuitry like that shown in FIG. 1 or FIG. 2 can interface with other circuitry of a PLD 100 that includes that driver circuitry. For convenience, the basic driver circuitry, whether like that shown in FIG. 1 or FIG. 2, will be referred to as driver 10 in the following discussion of FIG. 3.

In FIG. 3, soft IP 120 inside PLD 100 (e.g., inside the programmable, general-purpose, core logic circuitry 110 of PLD 100) receives one or more offset measure flag signals from the driver. On the basis of those flag signals, soft IP 120 determines how the offset-adjusting resources of driver 10 should be controlled. To effect these offset adjustments, soft IP 120 asserts control signals off-set[N:0] with values that soft IP 120 has determined to be appropriate. These control signals are used for such purposes as controlling the strength of secondary current sources like 26p, 26n, 36p, 36n, etc. in FIG. 1 or 66n in FIG. 2, and/or the polarity of signals like CONTA and CONTB in FIG. 2.

An illustrative technique for soft IP 120 to use to determine how the offset-adjusting resources of driver 10 should be controlled is to perform an algorithm, e.g., that has been programmed into the soft IP. For example, such an algorithm can step through each pre-distortion option, depending in part on what features the user has selected for each TX driver (e.g., desired value of Vod, how many pre-tap stages (like 50) will be used, how many post-tap stages (like 30 and 40) will be used, etc.) Then, as various data patterns are sent out via each driver, the offset flag or flags are monitored and appropriate changes are made to appropriate ones of the off-set[N:0] signals to try to eliminate or at least reduce any flag-indicated offset. When mismatch has been removed for one driver, soft IP 120 can deactivate dynamic control from that driver and select another driver for calibration. Such re-use of soft IP 120 for multiple drivers saves on required logic in PLD core 110.

In connection with the preceding paragraph's discussion, it may be desired to transmit various predetermined data patterns during calibration of a driver, because certain data patterns may more clearly reveal mismatches of various kinds. For example, one type of data pattern may bring out mismatch that can best be corrected by pre stage pre-distortion. It may therefore be desired to send that pattern while calibrating the pre stage. A different data pattern may bring out mismatch that can best be corrected by post1 stage pre-distortion. It may therefore be desired to transmit that data pattern while performing post1 stage calibration. In this way each stage of a driver can be exercised with a focus on that stage in order to find the best offset setting for each stage. Alternatively, or in addition, it may be desired to send data that is typical of what will subsequently be sent as real data during calibration of a driver in accordance with the invention.

The calibration process(es) described above can be repeated if TX driver configuration and/or power supply voltage have changed and would yield different results for each TX driver that can be stored in interface registers. These registers can be in the general-purpose programmable logic of the PLD and/or in special purpose ("hard IP") circuitry provided on the device (see below for more information regarding such possible hard IP). These registers can be read out, for example, during a wafer sort that takes place after preliminary calibration operations performed during wafer testing. This provides a TX analog path "design for test" or "DFT" feature where very large offsets can be screened out. This feature amounts to looking at the inherent mismatch of a part, which can be used, for example, to discard parts with very large mismatch or to direct parts with relatively large mismatch to uses for which that will not be a problem. Another possible use of this type of feature is to provide parts that when powered up, can go through soft IP on the part to wake up and automatically calibrate to some previously determined settings that at the very least compensate for inherent mismatch of the part.

As an alternative to performing pre-distortion calibration using soft IP, this feature can instead be implemented as hard IP (i.e., dedicated circuitry and/or fuses (or the like)) on the PLD. A possible benefit of a hard IP implementation may be speed-up of the calibration process. This might matter for applications that require fast release to user mode.

It will be understood that the foregoing is only illustrative of the principles of the invention, and that various modifications can be made by those skilled in the art without departing from the scope and spirit of the invention. For example, the number of pre and/or post stages can be different from the numbers of such stages in the illustrative embodiments that are specifically shown and described herein.

What is claimed is:

1. Transmitter driver circuitry comprising:
   a main driver stage for receiving a primary data signal and driving that signal onto an output node, the main driver stage including a first primary current source and a first secondary current source for use in selectively supplementing current provided by the first primary current source; and
   a second driver stage for receiving a phase-shifted version of the primary data signal and driving that phase-shifted version onto the output node, the second driver stage including a second primary current source and a second secondary current source for use in selectively supplementing current provided by the second primary current source, wherein the phase-shifted version is delayed in time relative to the primary data signal.

2. The circuitry defined in claim 1 wherein the first primary current source is controllable with respect to an amount of current that it provides.

3. The circuitry defined in claim 1 wherein the first secondary current source is controllable with respect to an amount of current that it provides.

4. The circuitry defined in claim 1 wherein each of the primary current sources is controllable with respect to an amount of current that it provides.

5. The circuitry defined in claim 1 wherein each of the secondary current sources is controllable with respect to an amount of current that it provides.

6. The circuitry defined in claim 1 wherein the output node comprises a pair of output terminals, a voltage-dividing resistor pair connected between the output terminals, and a common-mode voltage node connected intermediate the resistor pair.

7. The circuitry defined in claim 6 further comprising:
   means for monitoring an electrical condition adjacent the common-mode voltage node as a basis for controlling use of the first and second secondary current sources in selectively supplementing current provided by the first and second primary current sources.

8. The circuitry defined in claim 1 wherein the primary data signal controls an on/off state of a transistor through which current provided by both of the first primary and first secondary current sources flows.

9. The circuitry defined in claim 1 wherein the primary data signal controls an on/off state of a transistor through which current provided by the first primary current source flows, the first secondary current source having another connection to the output node that does not require current provided by the first secondary current source to flow through the transistor.

10. The circuitry defined in claim 9 wherein the another connection comprises another transistor whose on/off state is controlled by an offset control signal.

11. The circuitry defined in claim 1 wherein the second driver stage is one of a plurality of similar supplementary driver stages, each of which receives a version of the primary data signal that is phase-shifted by a respective different amount.

12. The circuitry defined in claim 11 wherein one of the amounts shifts the phase of the respective version ahead of the primary data signal, and wherein another of the amounts shifts the phase of the respective version behind the primary data signal.

13. The circuitry defined in claim 11 wherein two of the amounts shift the respective versions behind the primary data signal by two different amounts.

14. A programmable logic device comprising the circuitry defined in claim 1 and additional circuitry for controlling use of the first and secondary current sources in selectively supplementing current provided by the first and second primary current sources.

15. The programmable logic device defined in claim 14 wherein the additional circuitry comprises programmable logic circuitry.

16. The programmable logic device defined in claim 15 wherein the additional circuitry is programmed to monitor an electrical condition adjacent the output node as a basis for controlling use of the secondary current sources in selectively supplementing current provided by the primary current sources.

17. Transmitter driver circuitry comprising:
    a main push-pull driver stage for receiving a primary data signal and driving that signal onto an output node, the main driver stage including a first pull-up primary current source, a first pull-up secondary current source for use in selectively supplementing current provided by the first pull-up primary current source, a first pull-down primary current source, and a first pull-down secondary current source for use in selectively supplementing current provided by the first pull-down primary current source; and
    a second driver stage for receiving a phase-shifted version of the primary data signal and driving that phase-shifted version onto the output node, the second driver stage including a second pull-up primary current source, a second pull-up secondary current source for use in selectively supplementing current provided by the second pull-up primary current source, a second pull-down primary current source, and a second pull-down secondary current source for use in selectively supplementing current provided by the second pull-down primary current source.

18. The circuitry defined in claim 17 wherein each of the primary current sources is controllable with respect to an amount of current that it provides.

19. The circuitry defined in claim 17 wherein each of the secondary current sources is controllable with respect to an amount of current that it provides.

20. The circuitry defined in claim 17 wherein the output node comprises a pair of output terminals, a voltage-dividing resistor pair connected between the output terminals, and a common-mode voltage node connected intermediate the resistor pair.

21. The circuitry defined in claim 20 further comprising:
    means for monitoring an electrical condition adjacent the common-mode voltage node as a basis for controlling use of the secondary current sources in selectively supplementing current provided by the primary current sources.

22. A method of controlling pre-distortion of transmitter circuitry that includes first and second output driver stages, each output driver stage including primary and secondary current sources, and each output driver stage receiving a respective differently-phased version of an output signal for application to an output node of the transmitter circuitry, the method comprising:
    monitoring an electrical condition adjacent the output node;
    using a result of the monitoring to determine how the secondary current sources should be used to supplement current provided by the first current sources to affect said electrical condition; and
    controlling the secondary current sources in the manner determined in the using.

23. The method defined in claim 22 wherein the electrical condition is indicative of electrical offset at the output node.

24. The method defined in claim 22 wherein the controlling comprises:
   altering an amount of current provided by at least one of the secondary current sources.

25. The method defined in claim 22 wherein the controlling comprises:
   selectively switching at least one of the secondary current sources into or out of the circuitry.

26. The method defined in claim 22 further comprising:
   transmitting a data signal via the output node during the monitoring, the using, and the controlling.

27. The method defined in claim 26 wherein the data signal includes a predetermined pattern of data.

28. A method of controlling pre-distortion of transmitter circuitry that includes first and second output driver stages, each stage including a primary current source, and each stage receiving a respective differently-phased version of an output signal for application to an output node of the transmitter circuitry, and the transmitter circuitry further including a secondary current source that can be used to supply supplementary current to the output node, the method comprising:
   monitoring an electrical condition adjacent the output node;
   using a result of the monitoring to determine how the secondary current source should be used to supply supplementary current to the output node; and
   controlling use of the secondary current source in the manner determined in the using.

29. The method defined in claim 28 wherein the electrical condition is indicative of electrical offset at the output node.

30. The method defined in claim 28 wherein the controlling comprises:
   altering an amount of current provided by the secondary current source.

31. The method defined in claim 28 wherein the controlling comprises:
   selectively switching the secondary current source into or out of the circuitry.

* * * * *